(12) United States Patent
Hohle

(10) Patent No.: US 7,405,028 B2
(45) Date of Patent: Jul. 29, 2008

(54) POLYMERS BASED ON CINNAMIC ACID AS A BOTTOM ANTIREFLECTIVE COATING FOR 157 NM PHOTOLITHOGRAPHY

(75) Inventor: Christoph Hohle, Bubenreuth (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/044,728

(22) Filed: Jan. 28, 2005

(65) Prior Publication Data

US 2005/0170283 A1 Aug. 4, 2005

(30) Foreign Application Priority Data

Jan. 30, 2004 (DE) ................. 10 2004 004 865

(51) Int. Cl.
*G03C 1/825* (2006.01)
*G03C 1/835* (2006.01)
*G03C 1/73* (2006.01)
(52) U.S. Cl. .............. 430/270.1; 430/9; 430/18; 430/905; 430/910; 430/311
(58) Field of Classification Search ............ None
See application file for complete search history.

(56) References Cited

U.S. PATENT DOCUMENTS

| 2,690,966 A | | 10/1954 | Minsk et al. | |
| 3,376,138 A | * | 4/1968 | Gilano et al. | 430/286.1 |
| 6,312,870 B1 | * | 11/2001 | Malik et al. | 430/270.1 |
| 2002/0164548 A1 | | 11/2002 | Malik et al. | |

FOREIGN PATENT DOCUMENTS

| CH | 500514 | | 12/1970 |
| CH | 519736 | | 2/1972 |
| CH | 520957 | | 3/1972 |
| DE | 4226464 A1 | | 2/1994 |
| DE | 10137100 A1 | | 2/2003 |
| JP | 49-53639 | * | 5/1974 |
| JP | 2002-131534 | * | 5/2002 |
| WO | WO 99/21058 A1 | | 4/1999 |
| WO | WO 99/56178 A1 | | 11/1999 |
| WO | WO 00/57247 A1 | | 9/2000 |

OTHER PUBLICATIONS

Chem. Abstract 1974:544284—English abstract for Nakai et al (JP 49-53639).*
Chemical Abstract for Rzaev et al ("Alternating Cyclopolymerization of Allyl Trans-Cinnamate and Maleic Anhydride", Polymer (1994), vol. 35 (24), p. 5349-54.*
Rzaev et al ("Alternating Cyclopolymerization of Allyl trans-Cinnamate and Maleic Anhydride", Polymer, vol. 35, No. 24, pp. 5349-5354 (1994)).*
Derwent English abstract for JP 2002-131534.*
Claypool et al., Advances in Resist Technology and Processing, Proceedings of SPIE, vol. 4690, 2002, pp. 1065-1073.
Irie et al.; J. Photopolym. Sci. Technologie, vol. 16, No. 4, 2003, pp. 565-572.
Stobbe, Hans: "Photoreactions of the Cinnamylidene Benzyl Cyanide of the α-Phenyl-Cinnamylidene Acetic Acid, and of the Two Cinnamylidene Acetic Acids." *Chem. Ber.* 45, Nov. 9, 1912, pp. 3396-3408.
Stobbe, Hans, and Alice Lehfeldt: "Polymerizations and Depolymerizations by Light of Different Wavelengths" *Chem. Ber.* 58, Sep. 15, 1925, pp. 2415-2417.

* cited by examiner

*Primary Examiner*—Sin J. Lee
(74) *Attorney, Agent, or Firm*—Edell, Shapiro & Finnan, LLC

(57) ABSTRACT

A bottom antireflective coating for photolithography at 157 nm or less, where the bottom antireflective coating includes a crosslinkable polymer which contains cinnamic acid derivatives.

18 Claims, No Drawings

POLYMERS BASED ON CINNAMIC ACID AS A BOTTOM ANTIREFLECTIVE COATING FOR 157 NM PHOTOLITHOGRAPHY

CROSS REFERENCE TO RELATED APPLICATIONS

This application claims priority under 35 USC §119 to German Application No. DE 10 2004 004 865.7, filed on Jan. 30, 2004, and titled "Polymers Based on Cinnamic Acid as a Bottom Antireflective Coating for 157 NM Photolithography," the entire contents of which are hereby incorporated by reference.

FIELD OF THE INVENTION

The invention relates to a bottom antireflective coating for use in photolithography at a wavelength of 157 nm or less, and a process for the production of such an antireflective coating.

BACKGROUND

In order to increase the computational speed of processors and the storage volume of memory elements and to reduce the costs for the components, chips which have increasingly small structures and hence an increasingly high density of components are being developed in the semiconductor industry. A particular challenge is the reduction of the minimum structure size. To date, these requirements have been met in optical lithography by changing over to increasingly short wavelengths. At a structure size of from 100 to 70 nm, however, processes known to date which use wavelengths down to 193 nm come up against the limit of their resolution. The development of novel processes which use the shorter exposure wavelengths is therefore necessary. Optical lithography has particularly good prospects of being capable of being used industrially, a radiation having a wavelength of 157 nm being used for the exposure, since in this case the chip manufacturers can continue to utilize their extensive know-how of optical lithography. A substantial difficulty with the use of an exposure radiation having a wavelength of 157 nm is the insufficient transparency of the materials used to date as photoresists. For industrial use, the base polymer in these high-resolution resists must have as high a transparency as possible, and various fluorine-containing photoresists have therefore been proposed for use in 153 nm technology.

In the exposure of the photoresist, however, troublesome reflections or scattering effects at the coated interfaces frequently occur, so that the coating which is arranged under the photoresist is necessary to reduce these reflections or scattering. A so-called bottom antireflective coating ("BARC") which, in addition to avoiding reflections and scattering effects, also permits simultaneous planarization of already structured surfaces when it is applied by spin coating, is therefore applied between the substrate and the photoresist.

For 193 nm lithography, various BARCs have been developed that are formed either from inorganic materials, such as, for example, TiN, SiON or carbon, or from organic polymers. The present invention relates to a bottom antireflective coating which is composed of organic polymers.

Furthermore, the substrate reflections cannot be completely controlled with the 193 nm BARCs since, as a rule, the k value of the extinction coefficient at a wavelength of 157 nm is small. Another difficulty is that the photons at 157 nm have a higher energy than the photons at 193 nm, so that the polymer bonds of the photoresist may be cleaved, which may lead to the development of the low molecular weight polymer fragments and hence to the formation of gaseous products.

The organic BARC must also meet a number of further requirements. A BARC for 153 nm lithography must have not only suitable optical properties, such as, for example, refractive index (n), extinction coefficient (k), but also good adhesion properties with respect to silicon on the one hand and with respect to the photoresist on the other hand. The BARC must also have a higher etching rate compared with the photoresist in dry etching processes, and minimize formation of gaseous products. A further requirement for the BARC is that the BARC must not be softened or even dissolved by the solvent used for the photoresist, and that the edges structured after the etching must have a right angle, or that no "footing" forms.

Suitable properties which a BARC should have for 157 nm lithography are described in *Claypool et al., Advances in Resist Technology and Processing, Proceedings of SPIE, Vol. 4690*, 2002, pages 1065-1073, the disclosure of which is incorporated herein by reference in its entirety. In particular, the BARC must have, at 157 nm, a k value of from 0 to 0.70, a refractive index of from 1 to 2 and a thickness of less than 200 nm.

An exemplary BARC for use in 157 nm lithography is described in *Irie et al., J. Photopolym. Sci. Technologie, Vol. 16, No. 4*, 2003, pages 565-572, the disclosure of which is incorporated herein by reference in its entirety. The BAR disclosed in this reference consists of an acrylic polymer, novolak or heterocyclic polymer, where the polymers contain a side chain with Br or I atoms that absorb strongly at 157 nm. The content of halogen atoms is extremely high and is from 40 to 50% by weight of the polymer. The exact composition of the polymer is, however, not described.

SUMMARY OF THE INVENTION

An object of the present invention is to provide novel material classes which can be used as organic BARCs for 157 nm technology.

This and other objects are achieved in accordance with the invention by providing a bottom antireflective coating for photolithography using wavelengths of 157 nm or less, comprising a crosslinkable polymer which contains cinnamic acid derivatives.

In a preferred embodiment, the bottom antireflective coating comprises a polymer having the structure as described by one of the following formulas I-III:

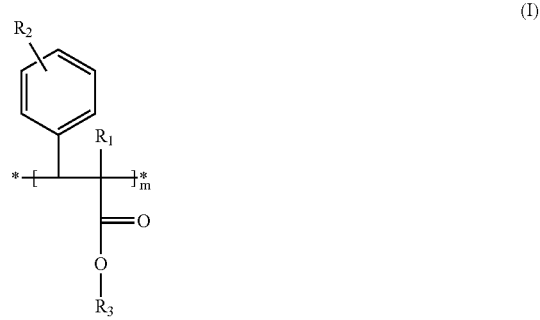

-continued

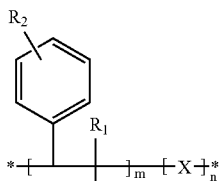
(II)

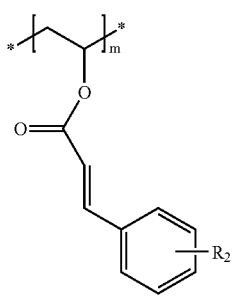
(III)

wherein:
R1 comprises H, halogen, a straight or branched alkyl chain including 1-10 C atoms, preferably a straight alkyl chain including 1-4 C atoms, which may be substituted, and most preferably a $CH_3$ group;

R2 comprises one or more substituents at one or more of the 1, 2, 3, 4 and 5 positions on the phenyl ring, each substituent being independent of each other and comprising H, a straight or branched alkyl chain including 1-4 C atoms, which may also preferably be substituted by a halogen, such as, for example, F or another halogen atom, $NO_2$, $NH_2$ or OH;

R3 is one of the following:

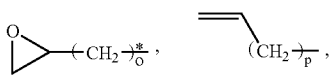

or another group comprising polymer units that are polymerizable with each other;

m is an integer of 1-10,000;

n is 0 or an integer of 1-10,000;

o and p are independent of each other and each is an integer of 1-10, preferably 1-4;

R4 comprises a carboxyl protective group, a straight or branched alkyl group including 1-4 C atoms, or a group cleavable by a nucleophilic reagent or acid; and X comprises a reactive anchor group, preferably acid anhydride, epoxide and ketene.

The above and still further objects, features and advantages of the present invention will become apparent upon consideration of the following detailed description of specific embodiments thereof.

DETAILED DESCRIPTION

The following terms as used herein are defined as follows:
"alkyl group" refers a straight or branched chain consisting of C—C bonds;
"anchor group" refers to a group which can react with an electrophilic or nucleophilic reagent, the reagent being linked to the anchor group;
"BARC" refers to a bottom antireflective coating applied to the substrate, or a formulation which is applied to the substrate and, optionally after the chemical or physical treatment, can be used as a bottom antireflective coating;
"halogen" refers to F, Cl, Br or I;
"hetero atom" refers to an atom which is not C or H;
"substituted" as used with a compound refers to one, several or all H atom(s) on the compound being replaced by another atom or another group.

It has been determined that polymers of cinnamic acid derivatives exhibit a greatly increased absorption ($\alpha_{10}$>15 $\mu m^{-1}$) at 157 nm. This absorption is decisively due to the cinnamic acid units but may be modified by the presence of other repeating units. It was surprisingly found that the ellipsometric measurements (VASE) give suitable values for the refractive index (n) and for the extinction coefficient (k). Furthermore, it was found that the adhesion properties of polymers based on cinnamic esters are very satisfactory both with respect to the substrate and with respect to the fluorinated photoresist, so that the polymers based on cinnamic esters can be used as BARCs.

Polymers based on cinnamic esters which are partly fluorinated are disclosed, for example, in DE 101 37 100 A1, the disclosure of which is incorporated herein by reference in its entirety. The polymers described in DE 101 37 100 A1 are copolymers between the partly fluorinated cinnamic ester monomers and the monomers based on unsaturated carboxylic anhydrides. These polymers are, however, used as photoresists and not as BARCs.

In accordance with the invention, a bottom antireflective coating for photolithography using wavelengths of 157 nm or less is provided, where the coating includes a crosslinkable polymer which contains cinnamic acid derivatives. In particular, a bottom antireflective coating is provided that includes a crosslinkable polymer which contains cinnamic esters. The cinnamic ester groups may be contained either in the polymer backbone or in side chains of the polymer.

In a preferred embodiment, the bottom antireflective coating includes a polymer including the structure which is reproduced by one of the following formulas I-III:

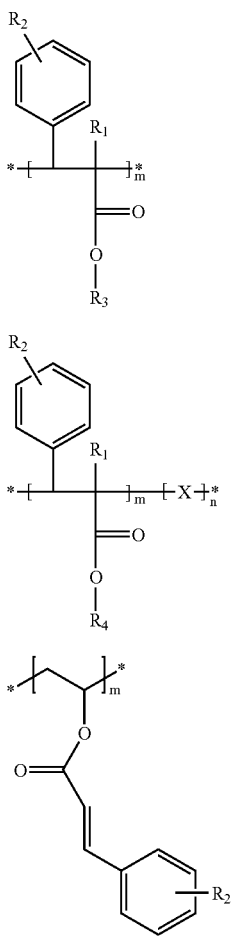

(I)

(II)

(III)

wherein:
R1 comprises H, halogen, a straight or branched alkyl chain including 1-10 C atoms, preferably a straight alkyl chain including 1-4 C atoms, which may be substituted, and most preferably a $CH_3$ group;
R2 comprises one or more substituents at one or more of the 1, 2, 3, 4 and 5 positions on the phenyl ring, each substituent being independent of each other and comprising H, a straight or branched alkyl chain including 1-4 C atoms, which may also preferably be substituted by a halogen, such as, for example, F or another halogen atom, $NO_2$, $NH_2$ or OH;
R3 is one of the following:

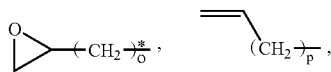

or another group comprising polymer units that are polymerizable with each other;
m is an integer of 1-10,000;
n is 0 or an integer of 1-10,000;
o and p are independent of each other and each is an integer of 1-10, preferably 1-4;
R4 comprises a carboxyl protective group, a straight or branched alkyl group including 1-4 C atoms, or a group cleavable by a nucleophilic reagent or acid; and X comprises a reactive anchor group, preferably acid anhydride, epoxide and ketene.

According to the present invention, after application to the substrate by spin coating, the BARC polymers are preferably crosslinked by either a wet chemical or photochemical method. The purpose of the crosslinking is to convert the polymer into an insoluble polymer and thus to avoid the occurrence of troublesome interactions, such as, for example, dissolution or partial dissolution or swelling in the resist solvent, during the coating with the photoresist.

There are a number of possibilities for crosslinking the cinnamic esters. The photochemical crosslinking possibilities are described in, for example, H. Stobbe: *"Lichtreaktionen des Cinnamylidenbenzylcyanids, der α-Phenyl-cinnamyliden-essigsäure und der beiden Cinnamyliden-essigsäuren"* [Photoreactions of cinnamylidenebenzyl cyanide, of α-phenylcinnamylideneacetic acid and of the two cinnamylideneacetic acids], Chem. Ber. 45, 1912, pages 3396-3408; H. Stobbe and A. Lehfeldt: *"Polymerisationen und Depolymerisationen durch Licht verschiedener Wellenlänge II, α-und β-trans-Zimtsäure, allo-Zimtsäure und ihre Dimere"* [Polymerizations and depolymerizations by light of different wavelengths II, α- and β-trans-cinnamic acid, allo-cinnamic acid and their dimers], Chem. Ber. 58, 1925, 2415-2427; L. Minsk and W. P. VanDeusen: *"Photomechanical Resist"* 1-8 (1954), the disclosures of which are incorporated herein by reference in their entireties.

On exposure of the polyvinylcinnamates of the formula III to light, dimerization occurs as a result of [2+2] cycloaddition in the solid with formation of insoluble isomeric truxin or truxil derivatives.

The structure of the crosslinked polymer according to formula III is reproduced below by the formulas IVa and IVb:

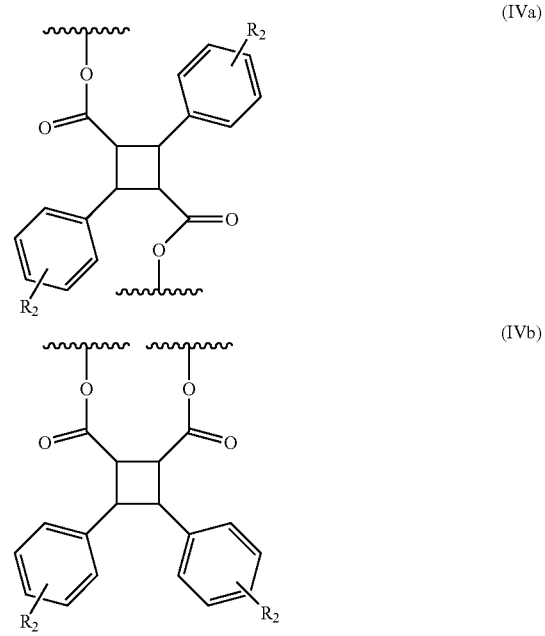

wherein R2 is as defined above for formulas (I-III).

Crosslinking of the novel polymers of the formula I takes place if the polymerizable groups, such as, for example, an epoxide group or an unsaturated bond in the form of ester groups, have been introduced. If the ester unit has, for example, a double bond, polymerization likewise occurs during the exposure to light with initiators. It is possible to effect the crosslinking also by means of the other groups which can react either with one another or with another polymer group. The polymerization possibilities and the polymerizable groups are described, for example, in *Römpp Chemie-Lexikon, Volume 5, Georg Thieme Verlag, Stuttgart-New York*, 10*th Edition*, 1998, page 3473, the disclosure of which is incorporated herein by reference in its entirety. The crosslinking can be controlled in a targeted manner by adding corresponding photoinitiators and thermal initiators.

The introduction of the polymerizable units can be effected either before the homopolymerization of the cinnamic esters, which is initiated, for example, by free radicals, or in a separate step.

Another possibility of achieving the crosslinking is by the introduction of a second repeating unit which includes reactive anchor groups. This principle is already known for amplifying the layer thickness of resist structures as described in EP 0 395 917 B1, the disclosure of which is incorporated herein by reference in its entirety. The same concept can be used according to the present invention for crosslinking the polymer according to the invention. A reactive anchor group is understood as meaning an anchor group which can react with a bifunctional agent with formation of a chemical bond without first having to be liberated or activated. The agent contains two suitable linking groups, for example two amino groups, with which it can react with the reactive anchor group. Reactive anchor groups chosen are those groups which have sufficient reactivity to ensure the crosslinking reaction within a duration acceptable for industrial applications. The reactive anchor group is preferably selected from the group consisting of acid anhydride, epoxide and ketene. Different reactive anchor groups may also be present in the polymer.

In this embodiment, the second repeating units are preferably derived from unsaturated carboxylic anhydrides. The carboxylic anhydrides are introduced into the polymer of the photoresist by copolymerization with cinnamic ester derivatives. The carboxylic anhydrides must therefore have a polymerizable double bond. Examples of suitable comonomers are maleic anhydride, itaconic anhydride, methacrylic anhydride, cyclohexenedicarboxylic anhydride or norbornenedicarboxylic anhydride.

The proportion of the second repeating units, which are derived from a monomer having anchor groups, may be freely chosen within further ranges. In order to permit sufficient crosslinking, the proportion of the second repeating unit is from 10 to 50 mol %, based on the total amount of all repeating units.

A preferred anchor group is the acid anhydride group. This acid anhydride group may be introduced into the polymer according to the invention, for example, by introducing the second repeating units based on maleic anhydride. In this embodiment, the polymer according to the invention contains a structure according to the formula V shown below:

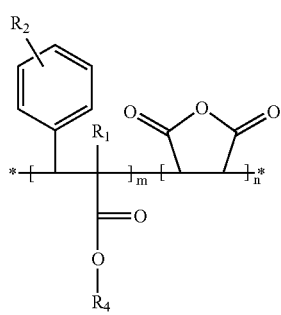

(V)

wherein R1, R2, R4, m and n are as described above for formulas (I-III).

The preparation of the unsubstituted cinnamic acid copolymers via a free radical copolymerization has been described, for example, in the thesis by *Boerndoerfer in "Medienkontrolierte Strukturierung modifizierter Polymere" [Media-controlled structuring of modified polymers]* (*University Library of Erlangen, Germany*, 1991).

The polymer according to the invention can be crosslinked using a reactive agent, such as, for example, using bifunctional amines, bifunctional alcohols or bifunctional isocyanates.

In addition to the crosslinking in a separate step, the crosslinking can be effected in situ with a protected, bifunctional crosslinking agent. A suitable protected crosslinking agent is, for example, the thermally labile bisamines already present in the BARC formulation, or the bifunctional thermo acids.

A further possibility for crosslinking comprises introducing a thermally labile group into the polymer according to the invention, in the ester moiety of the cinnamic ester, which thermally labile group can then undergo an intermolecular or intramolecular reaction with the anhydride units of the maleic ester repeating unit during the BARC baking step. Such a group may be, for example, tert-butyl cinnamate.

The polymer according to the invention then has the structure according to the formula VI:

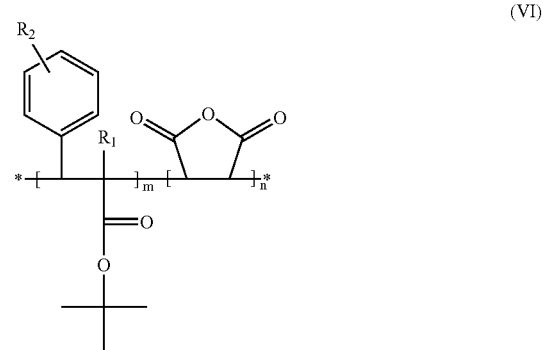

(VI)

wherein R1, R2, m and n are as defined for formulas (I-III).

The invention is now explained in more detail with reference to the example:

General Method for the Preparation of Substituted Alkyl Cinnamates 1 mol of the cinnamoyl chloride corresponding to the ester to be prepared is cooled to 0° C. in 1.5 liters of anhydrous diethyl ether and under inert gas. 1.1 mol of the corresponding substituted lithium alcoholate in 1 liter of diethyl ether are then added dropwise so that the temperature remains below 5° C. The reaction mixture is refluxed for a further 3 hours to increase the conversion and, after cooling, is added to 2 liters of $H_2O$. The organic phase is separated off and is extracted by shaking twice with 100 ml portions of $H_2O$. The combined organic phases are dried over sodium sulfate, and freed from the solvent, and the residue is purified by vacuum distillation or, in the case of solid esters, by means of recrystallization. The yields are 60-80%.

Copolymerization of the Substituted Alkyl Cinnamates with Maleic Anhydride

The corresponding monomers are weighed in different proportions by weight, dissolved in customary aprotic solvents and polymerized with azobisisobutyronitrile (AIBN, 1 mol %) over 24 hours. The copolymers obtained are precipitated several times in heptane and dried in vacuo to constant weight.

Absorption Measurements

The measurement in Table 1 shows the results of VASE (variable angle spinning ellipsometry): measurements of a copolymer of maleic anhydride and tert-butyl cinnamate (50: 50 mol %). For this purpose, the polymer was dissolved in PGMEA (methoxypropyl acetate) and applied to a silicon wafer by spin coating. Residual solvent was then evaporated by a heating step (post apply bake, PAB) at 110° C. in the course of 60 seconds. The coat thickness is about 80 nm and, at 157 nm, has a refractive index n of 1.14 and an extinction coefficient k of 0.46 at an absorption $\alpha_{10}=16.03$ μm$^{-1}$. The results are reproduced in Table 1.

TABLE 1

| Nm | N | K | α(μm$^{-1}$) | α10 (μm$^{-1}$) |
|---|---|---|---|---|
| 152.8 | 1.122688 | 0.4115688 | 33.847683 | 14.697213 |
| 154.4 | 1.131429 | 0.4370916 | 35.574190 | 15.446891 |
| 156 | 1.086296 | 0.4320365 | 34.802120 | 15.111645 |
| 157.6 | 1.139161 | 0.4629619 | 36.914662 | 16.028945 |
| 159.2 | 1.193801 | 0.4892776 | 38.620877 | 16.769812 |
| 160.8 | 1.24263 | 0.499959 | 39.071331 | 16.965406 |
| 162.4 | 2.272307 | 0.5003104 | 38.713583 | 16.810066 |
| 164 | 1.283846 | 0.4947603 | 37.910617 | 16.461405 |
| 165.6 | 1.343059 | 0.4999837 | 37.940703 | 16.474469 |
| 167.2 | 1.356864 | 0.5086709 | 38.230544 | 16.600323 |
| 168.8 | 1.365482 | 0.507985 | 37.817107 | 16.420802 |
| 170.4 | 1.377778 | 0.5311055 | 39.167068 | 17.006977 |
| 172 | 1.416212 | 0.5514316 | 40.287754 | 17.493597 |
| 173.6 | 1.432603 | 0.570547 | 41.300144 | 17.933193 |
| 175.2 | 1.45529 | 0.5862196 | 42.047104 | 18.257535 |
| 176.8 | 1.499321 | 0.5822281 | 41.382885 | 17.969120 |
| 178.4 | 1.520973 | 0.5741409 | 40.442081 | 17.560608 |
| 180 | 1.537734 | 0.5636775 | 39.352113 | 17.087326 |
| 181.6 | 1.552965 | 0.549834 | 38.047454 | 16.520822 |
| 183.2 | 1.548591 | 0.5469239 | 37.515548 | 16.289860 |
| 184.8 | 1.55507 | 0.5485459 | 37.301033 | 16.196714 |
| 186.4 | 1.561629 | 0.549081 | 37.016927 | 16.073351 |
| 188 | 1.582827 | 0.5466561 | 36.539804 | 15.866176 |
| 190 | 1.615423 | 0.5358261 | 35.438891 | 15.388142 |
| 191 | 1.635399 | 0.5220672 | 34.348114 | 14.914509 |
| 192 | 1.655378 | 0.5078452 | 33.238390 | 14.432648 |
| 193 | 1.677641 | 0.4884302 | 31.802046 | 13.808964 |
| 194 | 1.700481 | 0.4662251 | 30.199780 | 13.113235 |
| 195 | 1.721271 | 0.4427022 | 28.529025 | 12.387766 |
| 196 | 1.74216 | 0.4133655 | 26.502571 | 11.507847 |
| 200 | 1.774401 | 0.2861923 | 17.981992 | 7.8080731 |
| 204 | 1.750686 | 0.2028861 | 12.497754 | 5.4267279 |
| 208 | 1.722851 | 0.1630439 | 9.8503368 | 4.2771762 |
| 212 | 1.714355 | 0.1400805 | 8.3033182 | 3.6054356 |
| 216 | 1.713824 | 0.1088774 | 6.3342303 | 2.7504256 |
| 220 | 1.70467 | 0.0712039 | 4.0671612 | 1.7660274 |
| 224 | 1.683204 | 0.0393024 | 2.204860 | 0.9573860 |
| 228 | 1.654346 | 0.0224407 | 1.2368356 | 0.5370541 |
| 232 | 1.633224 | 0.0173751 | 0.9411339 | 0.4086556 |

While the invention has been described in detail and with reference to specific embodiments thereof, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equivalents.

What is claimed is:

1. A bottom antireflective coating for photolithography using wavelengths of 157 nm or less, the coating being formed from a polymer comprising cinnamic acid derivatives of at least one of the following formulas I-III:

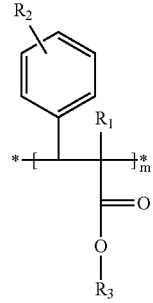

(I)

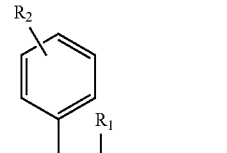

(II)

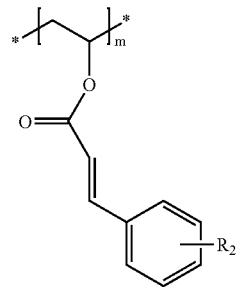

(III)

wherein:
R1 comprises at least one of H, halogen, and a straight or branched alkyl chain including 1-10 carbon atoms;
R2 for the compounds of formulas (I) and (II) comprises one or more substituents at one or more of the 1, 2, 3, 4 and 5 positions on the phenyl ring, the one or more substituents being independent of each other and each substituent comprising at least one of H, a straight or branched alkyl chain including 1-4 carbon atoms, a halogen, NO$_2$, NH$_2$ and OH;
R2 for the compound of formula (III) comprises one or more substituents at one or more of the 1, 2, 3, 4 and 5 positions on the phenyl ring, the one or more substituents being independent of each other and each substituent comprising at least one of a straight or branched alkyl chain including 2-4 carbon atoms, a halogen, NO$_2$, NH$_2$ and OH;
R3 comprises

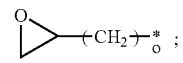

m is an integer of 1-10,000;
n is an integer of 1-10,000;
o is an integer of 1-10;
R4 comprises a carboxyl protective group, a straight or branched alkyl group including 1-4 carbon atoms, or a group cleavable by a nucleophilic reagent or acid; and
X comprises a reactive anchor group selected from the group consisting of acid anhydride, epoxide and ketene when R2 includes at least one of a straight or branched alkyl chain including 1-4 carbon atoms, Cl, Br, I, $NO_2$, $NH_2$ and OH, and X comprises a reactive anchor group selected from the group consisting of epoxide and ketene when R2 includes at least one of H, a straight or branched alkyl chain including 1-4 carbon atoms, F, Cl, Br, I, $NO_2$, $NH_2$ and OH;
wherein no cinnamic derivative of the crosslinkable polymer has any of the following formulas:

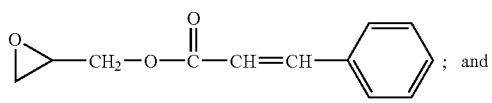
; and

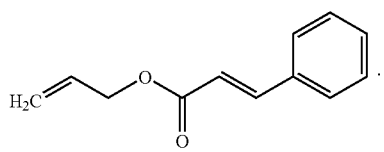
.

2. The bottom antireflective coating of claim 1, wherein the polymer comprises at least one cinnamic acid derivative of formula (II), and the reactive anchor group is an acid anhydride group.

3. The bottom antireflective coating of claim 2, wherein the acid anhydride group is derived from maleic anhydride, itaconic anhydride, methacrylic anhydride, cyclohexenedicarboxylic anhydride or norbornenedicarboxylic anhydride.

4. The bottom antireflective coating of claim 3, wherein the acid anhydride group is derived from maleic anhydride.

5. The bottom antireflective coating of claim 4, wherein the polymer has a structure according to the following formula V:

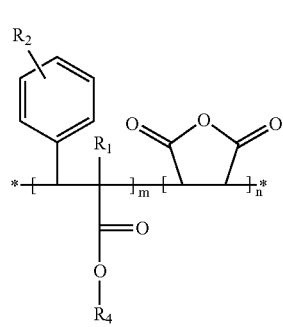
(V)

wherein R1, R2, R4, m and n are as described above for formulas (I-II).

6. The bottom antireflective coating of claim 5, wherein the polymer has a structure of the following formula VI:

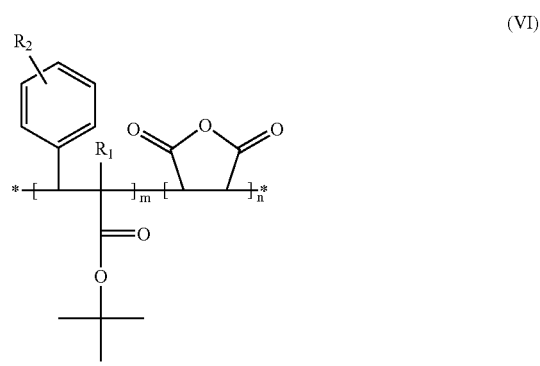
(VI)

wherein R1, R2, m and n are as defined for formulas (I-II).

7. The bottom antireflective coating of claim 1, wherein a molar proportion of the second repeating unit X of the polymer of formula (II) is in a range from 10 to 50 mol %.

8. The bottom antireflective coating of claim 1, wherein the polymer is crosslinked.

9. The bottom antireflective coating of claim 8, wherein the crosslinking is achieved photochemically.

10. The bottom antireflective coating of claim 8, wherein the crosslinking is achieved utilizing a wet chemical method.

11. The bottom antireflective coating of claim 10, wherein the crosslinking is achieved using bifunctional amines, bifunctional alcohols or bifunctional isocyanates.

12. The bottom antireflective coating of claim 1, wherein cinnamic acid derivatives are contained either in the polymer backbone or in side chains of the polymer.

13. A formulation for the production of a bottom antireflective coating for photolithography using wavelengths of not more than 157 nm, comprising a polymer, a solvent and a stabilizer wherein the polymer comprises cinnamic acid derivatives of at least one of the following formulas I-III:

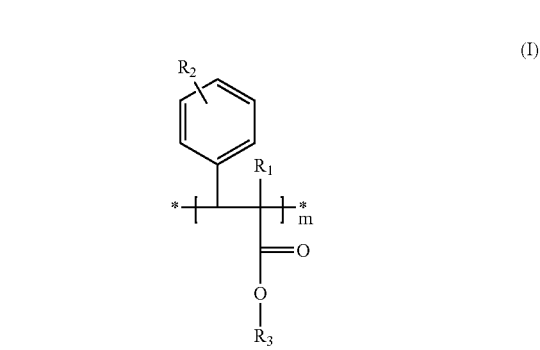
(I)

-continued

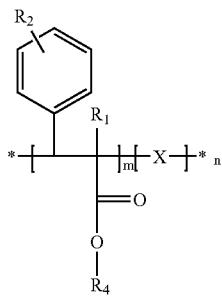
(II)

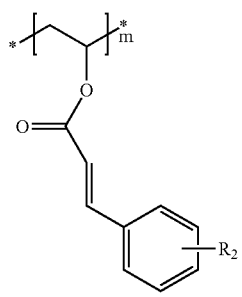
(III)

wherein:
R$_1$ comprises at least one of H, halogen, and a straight or branched alkyl chain including 1-10 carbon atoms;
R$_2$ for the compounds of formulas (I) and (II) comprises one or more substituents at one or more of the 1, 2, 3, 4 and 5 positions on the phenyl ring, the one or more substituents being independent of each other and each substituent comprising at least one of H, a straight or branched alkyl chain including 1-4 carbon atoms, a halogen, NO$_2$, NH$_2$ and OH;
R$_2$ for the compound of formula (III) comprises one or more substituents at one or more of the 1, 2, 3, 4 and 5 positions on the phenyl ring, the one or more substituents being independent of each other and each substituent comprising at least one of a straight or branched alkyl chain including 2-4 carbon atoms, a halogen, NO$_2$, NH$_2$ and OH;
R$_3$ comprises

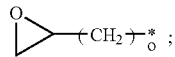

m is an integer of 1-10,000;
n is an integer of 1-10,000;
o is an integer of 1-10;
R$_4$ comprises a carboxyl protective group, a straight or branched alkyl group including 1-4 carbon atoms, or a group cleavable by a nucleophilic reagent or acid; and
X comprises a reactive anchor group selected from the group consisting of acid anhydride, epoxide and ketene when R$_2$ includes at least one of a straight or branched alkyl chain including 1-4 carbon atoms, Cl, Br, I, NO$_2$, NH2 and OH, and X comprises a reactive anchor group selected from the group consisting of epoxide and ketene when R$_2$ includes at least one of H, a straight or branched alkyl chain including 1-4 carbon atoms, F, Cl, Br, I, NO$_2$, NH$_2$ and OH;
wherein no cinnamic derivative of the crosslinkable polymer has any of the following formulas:

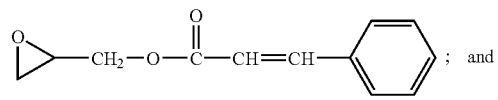 ; and

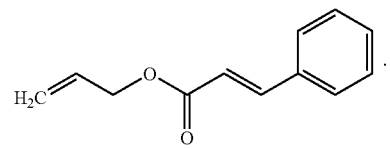

14. The formulation of claim 13, comprising a protected, bifunctional crosslinking agent.

15. The formulation of claim 14, wherein the protected, bifunctional crosslinking agent is selected from the group consisting of thermally labile bisamines and bifunctional thermo acids.

16. A process for the production of a bottom antireflective coating, comprising the following steps:
applying the formulation of claim 13 to a substrate by spin coating;
evaporating the solvent in a post apply bake (PAB) step; and
crosslinking the polymer contained in the formulation.

17. A process for conducting photolithography using wavelengths of 157 nm or less, comprising the step of using a polymer for the production of a bottom antireflective coating for the photolithography process, wherein the polymer comprises cinnamic acid derivatives of at least one of the following formulas I-III:

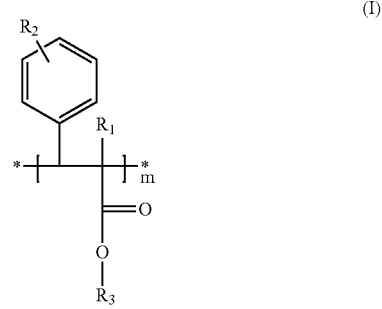
(I)

-continued

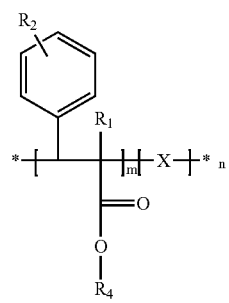
(II)

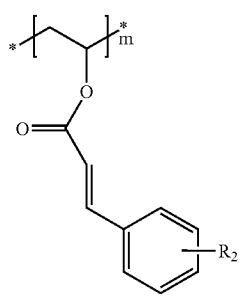
(III)

wherein:
- R₁ comprises at least one of H, halogen, and a straight or branched alkyl chain including 1-10 carbon atoms;
- R₂ for the compounds of formulas (I) and (II) comprises one or more substituents at one or more of the 1, 2, 3, 4 and 5 positions on the phenyl ring, the one or more substituents being independent of each other and each substituent comprising at least one of H, a straight or branched alkyl chain including 1-4 carbon atoms, a halogen, NO₂, NH₂ and OH;
- R₂ for the compound of formula (III) comprises one or more substituents at one or more of the 1, 2, 3, 4 and 5 positions on the phenyl ring, the one or more substituents being independent of each other and each substituent comprising at least one of a straight or branched alkyl chain including 2-4 carbon atoms, a halogen, NO₂, NH₂ and OH;
- R₃ comprises

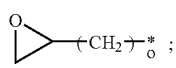

- m is an integer of 1-10,000;
- n is an integer of 1-10,000;
- o is an integer of 1-10;
- R₄ comprises a carboxyl protective group, a straight or branched alkyl group including 1-4 carbon atoms, or a group cleavable by a nucleophilic reagent or acid; and
- X comprises a reactive anchor group selected from the group consisting of acid anhydride, epoxide and ketene when R₂ includes at least one of a straight or branched alkyl chain including 1-4 carbon atoms, Cl, Br, I, NO₂, NH₂ and OH, and X comprises a reactive anchor group selected from the group consisting of epoxide and ketene when R₂ includes at least one of H, a straight or branched alkyl chain including 1-4 carbon atoms, F, Cl, Br, I, NO₂, NH₂ and OH;

wherein no cinnamic derivative of the crosslinkable polymer has any of the following formulas:

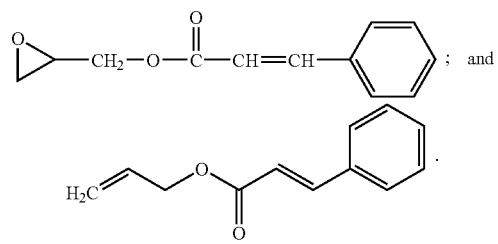

18. A composition comprising a crosslinkable polymer including cinnamic acid derivatives of at least one of the following formulas I-III:

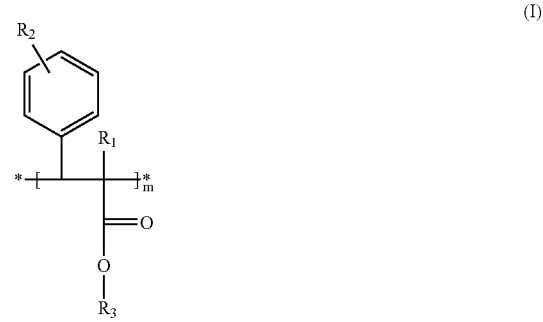
(I)

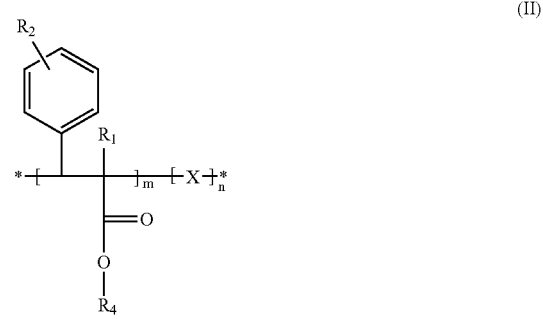
(II)

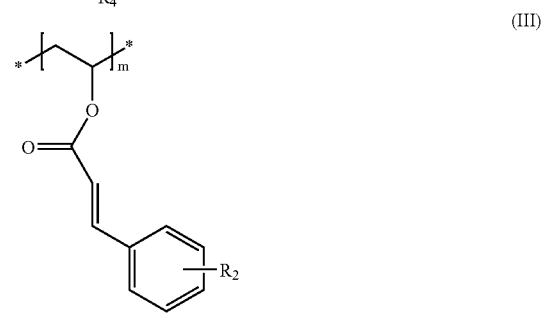
(III)

wherein:
- R1 comprises at least one of H, halogen, and a straight or branched alkyl chain including 1-10 carbon atoms;
- R2 for the compounds of formulas (I) and (II) comprises one or more substituents at one or more of the 1, 2, 3, 4 and 5 positions on the phenyl ring, the one or more substituents being independent of each other and each substituent comprising at least one of H, a straight or branched alkyl chain including 1-4 carbon atoms, a halogen, NO₂, NH₂ and OH;

R2 for the compound of formula (III) comprises one or more substituents at one or more of the 1, 2, 3, 4 and 5 positions on the phenyl ring, the one or more substituents being independent of each other and each substituent comprising at least one of a straight or branched alkyl chain including 2-4 carbon atoms, a halogen, $NO_2$, $NH_2$ and OH;

R3 comprises

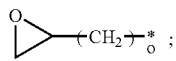

m is an integer of 1-10,000;
n is an integer of 1-10,000;
o is an integer of 1-10;
R4 comprises a carboxyl protective group, a straight or branched alkyl group including 1-4 carbon atoms, or a group cleavable by a nucleophilic reagent or acid;
X comprises a reactive anchor group selected from the group consisting of acid anhydride, epoxide and ketene when R2 includes at least one of a straight or branched alkyl chain including 1-4 carbon atoms, Cl, Br, I, $NO_2$, $NH_2$ and OH, and X comprises a reactive anchor group selected from the group consisting of epoxide and ketene when R2 includes at least one of H, a straight or branched alkyl chain including 1-4 carbon atoms, F, Cl, Br, I, $NO_2$, $NH_2$ and OH; and wherein no cinnamic derivative of the crosslinkable polymer has any of the following formulas:

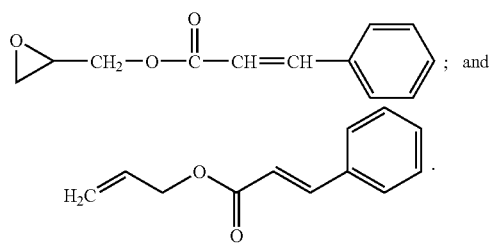

* * * * *